US006699636B2

(12) United States Patent
Savariar-Hauck

(10) Patent No.: US 6,699,636 B2
(45) Date of Patent: Mar. 2, 2004

(54) IMAGING ELEMENT COMPRISING A THERMALLY ACTIVATED CROSSLINKING AGENT

(75) Inventor: Celin Savariar-Hauck, Badenhausen (DE)

(73) Assignee: Kodak Polychrome Graphics LLC, Norwalk, CT (US)

( * ) Notice: Subject to any disclaimer, the term of this patent is extended or adjusted under 35 U.S.C. 154(b) by 153 days.

(21) Appl. No.: 10/020,476

(22) Filed: Dec. 12, 2001

(65) Prior Publication Data

US 2003/0113654 A1 Jun. 19, 2003

(51) Int. Cl.[7] ......................... G03F 7/004; G03F 7/023; G03F 7/027

(52) U.S. Cl. .................... 430/270.1; 430/165; 430/166; 430/302

(58) Field of Search ................................ 430/165, 166, 430/302, 270.1

(56) References Cited

U.S. PATENT DOCUMENTS

| | | | | |
|---|---|---|---|---|
| 4,749,639 A | | 6/1988 | Frommeld | 430/175 |
| 5,008,175 A | | 4/1991 | Hsieh et al. | 430/155 |
| 6,040,113 A | * | 3/2000 | Van Damme et al. | 430/271.1 |
| 6,143,464 A | | 11/2000 | Kawauchi | 430/270.1 |
| 6,194,122 B1 | | 2/2001 | Ichikawa et al. | 430/272.1 |
| 6,294,311 B1 | | 9/2001 | Shimazu et al. | 430/271.1 |
| 6,352,811 B1 | | 3/2002 | Patel et al. | 430/270.1 |

FOREIGN PATENT DOCUMENTS

| | | |
|---|---|---|
| EP | 0 864 420 A1 | 9/1998 |
| EP | 0 908 779 A1 | 4/1999 |
| EP | 0 909 657 A2 | 4/1999 |
| EP | 0 943 451 A1 | 9/1999 |
| EP | 0 950 513 A1 | 10/1999 |
| EP | 0 950 514 A1 | 10/1999 |
| EP | 0 950 516 A1 | 10/1999 |
| EP | 0 950 518 A1 | 10/1999 |
| FR | 2 485 759 | 12/1981 |

* cited by examiner

*Primary Examiner*—John S. Chu
(74) *Attorney, Agent, or Firm*—RatnerPrestia

(57) ABSTRACT

Imageable elements useful in lithographic printing, and processes for their use, are disclosed. The elements comprise a hydrophilic substrate, an imageable layer over the substrate, and a thermally activated crosslinking agent. The imageable layer comprises a polymeric material that comprises one or more functional groups selected from the group consisting of carboxyl, carboxylic acid anhydride, phenolic hydroxyl, and sulphonamide. A preferred crosslinking group is the oxazoline group. The element is heated after exposure and development to crosslink a polymeric material.

46 Claims, No Drawings

IMAGING ELEMENT COMPRISING A THERMALLY ACTIVATED CROSSLINKING AGENT

FIELD OF THE INVENTION

The invention relates to imageable elements useful in lithographic printing. More particularly, this invention relates to imageable elements with improved run length in which the element comprises a thermally activated crosslinking agent and to methods for their use to form lithographic printing plates.

BACKGROUND OF THE INVENTION

In lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. Typically, the ink is first transferred to an intermediate blanket, which in turn transfers the ink to the surface of the material upon which the image is to be reproduced.

Imageable elements useful as lithographic printing plates, also called printing plate precursors, typically comprise a radiation sensitive imageable layer applied over a hydrophilic surface of a substrate. The imageable layer includes one or more radiation-sensitive components, which may be dispersed in a suitable binder. Alternatively, the radiation-sensitive component can also be the binder material. If after imaging the exposed regions of the imageable layer are removed in the developing process, revealing the underlying hydrophilic surface, the plate is called as a positive-working printing plate. Conversely, if the unexposed regions are removed by the developing process and the exposed regions remain, the plate is called a negative-working plate. In each instance, the regions of the imageable layer that remain are ink-receptive and the regions of the hydrophilic surface revealed by developing process accept water, typically a fountain solution, and repel ink.

In use, a lithographic printing plate comes in contact with fountain solution and may subjected to aggressive blanket washes, such as a "UV wash" to remove ultraviolet curable inks. However, many imageable layers have limited resistance to either fountain solution and/or aggressive blanket washes.

Attempts have been made to improve the resistance of lithographic printing plates to fountain solution and to blanket washes. Kawauchi, U.S. Pat. No. 6,143,464 (EP 0 894 622), for example, discloses single-layer lithographic printing plates in which the photosensitive composition comprises a phenolic resin and a copolymer comprising 10 mol % or more of at least one acrylic polymer having a sulfonamide group. However, even when these plates are baked for extremely high run lengths, often no significant increase in run length is achieved due to poor abrasive resistance of the printing surface. Thus, a need exists for improved imageable elements that do not suffer from these disadvantages.

SUMMARY OF THE INVENTION

In one aspect, the invention is an imageable element suitable for use as a lithographic printing plate precursor. The element comprises, in order:

(a) a substrate comprising a hydrophilic surface; and (b) an imageable layer over the hydrophilic surface;

in which:

- the imageable layer is ink receptive;
- the element comprises a compound that comprises a multiplicity of oxazoline groups;
- the element comprises a polymeric material that comprises one or more functional groups selected from the group consisting of carboxyl, carboxylic acid anhydride, phenolic hydroxyl, and sulphonamide; and
- the compound that comprises the multiplicity of oxazoline groups and the polymeric material that comprises one or more functional groups selected from the group consisting of carboxyl, carboxylic acid anhydride, phenolic hydroxyl, and sulphonamide are in the same layer.

In another aspect, the invention is a positive-working imageable element suitable for use as a lithographic printing plate precursor. The element comprises, in order:

(a) a substrate comprising a hydrophilic surface; and (b) an imageable layer over the hydrophilic surface;

in which:

- the imageable layer is ink receptive;
- the element comprises a compound that comprises a multiplicity of oxazoline groups;
- the element comprises a polymeric material that comprises one or more functional groups selected from the group consisting of carboxyl, carboxylic acid anhydride, phenolic hydroxyl, and sulphonamide; and
- the compound that comprises the multiplicity of oxazoline groups and the polymeric material that comprises one or more functional groups selected from the group consisting of carboxyl, carboxylic acid anhydride, phenolic hydroxyl, and sulphonamide are in the same layer.

In another aspect, the invention is a method for forming a lithographic printing plate. The method comprises the steps of (a) imaging an imageable element of the invention to form a imaged element, (b) developing the imaged element with a developer to form a developed element, and (c) forming the lithographic printing plate by baking the developed element and crosslinking the polymeric material that comprises one or more functional groups selected from the group consisting of carboxyl, carboxylic acid anhydride, phenolic hydroxyl, and sulphonamide, in which the thermally activated crosslinking groups do not substantially crosslink the polymeric material prior to step (c).

DETAILED DESCRIPTION OF THE INVENTION

Unless the context indicates otherwise, in the specification and claims, the terms "first polymeric material," "second polymeric material," "photothermal conversion material," "dissolution inhibitor," monomer", "crosslinking agent," and similar terms also refer to mixtures of such materials.

In one aspect, the invention is an imageable element. The imageable element comprises an imageable layer over a hydrophilic substrate.

Hydrophilic Substrate

Substrates for lithographic printing are well known. The hydrophilic substrate, i.e., the substrate that comprises at least one hydrophilic surface, comprises a support, which may be any material conventionally used to prepare imageable elements useful as lithographic printing plates. The support is preferably strong, stable and flexible. It should resist dimensional change under conditions of use so that color records will register in a full-color image. Typically, it can be any self-supporting material, including, for example, polymeric films such as polyethylene terephthalate film, ceramics, metals, or stiff papers, or a lamination of any of these materials. Metal supports include aluminum, zinc, titanium, and alloys thereof.

The surface of an aluminum support may be treated by techniques known in the art, including physical graining, electrochemical graining, chemical graining, and anodizing. The substrate should be of sufficient thickness to sustain the wear from printing and be thin enough to wrap around a printing form, typically from about 100 to about 600 μm. Typically, the substrate comprises an interayer between the aluminum support and the imageable layer. The interlayer may be formed by treatment of the support with, for example, silicate, dextrine, hexafluorosilicic acid, phosphate/fluoride, polyvinyl phosphonic acid (PVPA) or polyvinyl phosphonic acid copolymers.

Single Layer Imageable Elements

The imageable element may be a single layer imageable element, comprising an imageable layer over a hydrophilic substrate, in which the imageable layer comprises the compound that comprises a multiplicity of oxazoline groups. As used herein, a single layer imageable element is an element that does not comprise a developer soluble or removable underlayer between the imageable layer and the substrate. Although an absorber layer may be present between the imageable layer and the substrate, preferably no layers are present between the imageable layer and the substrate. The imageable layer may be either positive working or negative working. The imageable layer may be photoimageable (i.e., imageable by ultraviolet and/or visible radiation) or thermally imageable.

Positive Working Photoimageable Elements

Positive working photoimageable elements are well known. They are described, for example, in Chapter 5 of *Photoreactive Polymers: the Science and Technology of Resists*, A. Reiser, Wiley, New York, 1989, pp. 178–225. The imageable layer comprises a photosensitive composition that comprises a first polymeric material, which is a water insoluble, alkali soluble binder, as well as a material that comprises a photosensitive moiety. The photosensitive moiety may be bonded to the polymeric material and/or it may be in a separate compound.

The photosensitive moiety is typically the o-diazonaphthoquinone moiety. Compounds that contain the o-diazonaphthoquinone moiety (i.e., quinone-diazides), preferably compounds that comprise an o-diazonaphthoquinone moiety attached to a ballasting moiety that has a molecular weight of at least 1500, but less than about 5000, are preferred. Typically, these compounds are prepared by the reaction of a 1,2-naphthoquinone diazide having a halogeno-sulfonyl group, typically a sulfonylchloride group, at the 4- or 5-position with a mono- or polyhydroxyphenyl compound, such as mono- or poly-hydroxy benzophenone.

Useful compounds include, but are not limited to: 2,4-bis(2-diazo-1,2-dihydro-1-oxo-5-naphthalenesulfonyloxy)benzophenone; 2-diazo-1,2-dihydro-1-oxo-5-naphthalenesulfonyloxy-2,2-bishydroxyphenylpropane monoester; the hexahydroxybenzophenone hexaester of 2-diazo-1,2-dihydro-1-oxo-5-naphthalenesulfonic acid; 2,2'-bis(2-diazo-1,2-dihydro-1-oxo-5-naphthalenesulfonyloxy)-biphenyl; 2,2',4,4'-tetrakis(2-diazo-1,2-dihydro-1-oxo-5-naphthalenesulfonyloxy)-biphenyl; 2,3,4-tris(2-diazo-1,2-dihydro-1-oxo-5-naphthalenesulfonyloxy)benzophenone; 2,4-bis(2-diazo-1,2-dihydro-1-oxo-4-naphthalenesulfonyloxy)benzophenone; 2-diazo-1,2-dihydro-1-oxo-4-naphthalenesulfonyloxy-2,2-bishydroxyphenylpropane monoester; the hexahydroxybenzophenone hexaester of 2-diazo-1,2-dihydro-1-oxo-4-naphthalenesulfonic acid; 2,2'-bis(2-diazo-1,2-dihydro-1-oxo-4-naphthalenesulfonyloxy)biphenyl; 2,2',4,4'-tetrakis(2-diazo-1,2-dihydro-1-oxo-4-naphthalenesulfonyloxy)biphenyl; 2,3,4-tris(2-diazo-1,2-dihydro-1-oxo-4-naphthalenesulfonyloxy)benzophenone; and others known in the art, for example, those described in Mizutani, U.S. Pat. No. 5,143,816.

Alternatively, or additionally, the imageable layer may comprise a polymeric diazonaphthoquinone compound. Polymeric diazonaphthoquinone compounds include derivatized resins formed by the reaction of a reactive derivative that contains a diazonaphthoquinone moiety and a polymeric material that contains a suitable reactive group, such as a hydroxyl or amino group. Suitable polymeric materials for forming these derivatized resins include the novolac resins, resole resins, polyvinyl phenols, acrylate and methacrylate copolymers of hydroxy-containing monomers such as hydroxystyrene. Representative reactive derivatives include sulfonic and carboxylic acid, ester, or amide derivatives of the diazonaphthoquinone moiety. Derivatization of phenolic resins with compounds that contain the diazonaphthoquinone moiety is well known in the art and is described, for example, in West, U.S. Pat. Nos. 5,705,308, and 5,705,322. An example of a polymer derivatized with a compound that comprises a diazonaphthoquinone moiety is P-3000, a naphthoquinone diazide of a pyrogallol/acetone resin (available from PCAS, France). They can be used alone in the imageable layer, or they can be combined with other polymeric materials and/or dissolution inhibitors.

In the positive working photoimageable elements, the first polymeric material is a light-stable, water-insoluble, aqueous alkaline developer soluble or removable, film-forming polymeric material that has a multiplicity of carboxyl, carboxylic acid anhydride, phenolic hydroxyl, or sulphonamide groups, preferably phenolic hydroxyl groups, either on the polymer backbone or on pendant groups. These groups impart aqueous alkaline developer solubility to the imageable layer. Novolac resins, resol resins, acrylic resins that contain pendent phenol groups, and polyvinyl phenol resins are preferred phenolic resins. Novolac resins are more preferred. Novolac resins are commercially available and are well known to those skilled in the art. Other phenolic resins useful as the polymeric material include polyvinyl compounds having phenolic hydroxyl groups. Such compounds include, for example, polyhydroxystyrenes and copolymers containing recurring units of a hydroxystyrene, and polymers and copolymers containing recurring units of substituted hydroxystyrenes. The first polymeric material may also be a water insoluble, base soluble polymeric compound having pendent sulfonamide groups, such as is described in Aoshima, U.S. Pat. No. 5,141,838 (EP 330,239).

Positive Working Thermally Imageable Elements

The imageable layer of a positive-working thermally imageable element comprises the first polymeric material and a dissolution inhibitor. The first polymeric material is a water insoluble and alkali soluble binder, such as is discussed above, typically a phenolic resin, such as a novolac resin. The dissolution inhibitors are believed not to be photoreactive to radiation in the range of about 600 nm to about 800 nm or to radiation in the range of about 800 nm to about 1200 nm, the ranges of radiation typically used for imaging thermally imageable elements. Such systems are disclosed in, for example, Parsons, U.S. Pat. No. 6,280,899, Nagasaka, EP 0 823 327; Miyake, EP 0 909 627; West, WO 98/42507; and Nguyen, WO 99/11458.

Useful polar groups for dissolution inhibitors include, for example, diazo groups; diazonium groups; keto groups; sulfonic acid ester groups; phosphate ester groups; triarylmethane groups; onium groups, such as sulfonium, iodonium, and phosphonium; groups in which a nitrogen atom is incorporated into a heterocyclic ring; and groups that contain a positively charged atom, especially a positively charged nitrogen atom, typically a quaternized nitrogen atom, i.e., ammonium groups. Compounds containing other polar groups, such as ether, amine, azo, nitro, ferrocenium, sulfoxide, sulfone, and disulfone may also be useful as dissolution inhibitors. Monomeric or polymeric acetals having recurring acetal or ketal groups, monomeric or polymeric ortho carboxylic acid esters having at least one ortho carboxylic acid ester or amide group, enol ethers, N-acyliminocarbonates, cyclic acetals or ketals, β-ketoesters or β-ketoamides may also be useful as dissolution inhibitors.

Compounds that contain a positively charged (i.e., quaternized) nitrogen atom useful as dissolution inhibitors include, for example, tetraalkyl ammonium compounds, quinolinium compounds, benzothiazolium compounds, pyridinium compounds, and imidazolium compounds.

Quaternized heterocyclic compounds are useful as dissolution inhibitors. Representative imidazolium compounds include Monazoline C, Monazoline O, Monazoline CY, and Monazoline T, all of which are manufactured by Mona Industries. Representative quinolinium dissolution inhibitors include 1-ethyl-2-methyl quinolinium iodide, 1-ethyl-4-methyl quinolinium iodide and cyanine dyes that comprise a quinolinium moiety such as Quinoldine Blue. Representative benzothiazolium compounds include 3-ethyl-2(3H)-benzothiazolylidene)-2-methyl-1-(propenyl) benzothiazolium cationic dyes and 3-ethyl-2-methylbenzothiazolium iodide. Suitable pyridinium dissolution inhibitors include cetyl pyridinium bromide and ethyl viologen dications. Diazonium salts are useful as dissolution inhibitors and include, for example, substituted and unsubstituted diphenylamine diazonium salts, such as methoxy-substituted diphenylamine diazonium hexafluoroborates.

A preferred group of dissolution inhibitors are triarylmethane dyes, such as ethyl violet, crystal violet, malachite green, brilliant green, Victoria blue B, Victoria blue R, and Victoria blue BO. These compounds can also act as contrast dyes, which distinguish the unimaged regions from the imaged regions in the developed imageable element. The dissolution inhibitor may be a monomeric and/or polymeric compound that comprises an o-diazonaphthoquinone moiety, such as is discussed above.

When a dissolution inhibitor is present in the imageable layer, its amount can vary widely, but generally it is at least about 0.1 wt %, typically about 0.5 wt % to about 30 wt %, preferably about 1 wt % to 15 wt %, based on the total dry composition weight of the layer.

Alternatively, or additionally, the first polymeric material itself can comprise polar groups that act as acceptor sites for hydrogen bonding with the hydroxy groups present in the polymeric material and, thus, act as a both the first polymeric material and dissolution inhibitor. Derivatization of the hydroxyl groups of the first polymeric material increases its molecular weight and reduces the number of hydroxyl groups, typically reducing both the solubility and the rate of dissolution of the first polymeric material in the developer. Although is important that the level of derivatization be high enough that the first polymeric material acts as a dissolution inhibitor, it should not be so high that, following thermal imaging, the first polymeric material is not soluble in the developer. As described above, derivatization of phenolic resins with compounds that contain the diazonaphthoquinone moiety is well known. Although the degree of derivatization required will depend on the nature of the polymeric material and the nature of the moiety containing the polar groups introduced into the polymeric material, typically about 0.5 mol % to about 5 mol %, preferably about 1 mol % to about 3 mol %, of the hydroxyl groups will be derivatized. These derivatized polymeric materials can act as both the first polymeric material and a dissolution inhibitor. They can be used alone in the imageable layer, or they can be combined with other polymeric materials and/or dissolution inhibitors.

One group of first polymeric materials that comprise polar groups and function as dissolution inhibitors are derivatized phenolic polymeric materials in which a portion of the phenolic hydroxyl groups have been converted to sulfonic acid esters, preferably phenyl sulfonates or p-toluene sulfonates. Derivatization can be carried by reaction of the polymeric material with, for example, a sulfonyl chloride such as p-toluene sulfonyl chloride in the presence of a base such as a tertiary amine. A preferred polymeric material is a derivatized novolac resin in which about 1 mol % to 3 mol %, preferably about 1.5 mol % to about 2.5 mol %, of the hydroxyl groups have been converted to phenyl sulfonate or p-toluene sulfonate (tosyl) groups.

It will be appreciated by those skilled in the art that although phenolic polymers which have been derivatized with polar groups (e.g., polymers in which some of the hydroxyl groups have been derivatized with sulfonic acid ester groups or with groups that contain the diazonaphthoquinone moiety) are soluble in aqueous alkaline developer, a layer comprising or consisting essentially of one or more of these materials is "insoluble" in aqueous alkaline developer. This is because solubility and insolubility of the layer are determined by the relative rates at which the imaged and unimaged regions of the layer are removed by the developer. Following imagewise thermal exposure of a layer comprising or consisting essentially of one or more of these derivatized phenolic polymeric materials, the exposed regions of the layer are removed by the aqueous alkaline developer more rapidly than the unexposed regions. If the development step is carried out for an appropriate time, the exposed regions are removed and the unexposed regions remain, so that an image made up of the unexposed regions is formed. Hence the exposed regions are "removable" or "soluble" in the aqueous developer and the unexposed regions are "not removable" or "insoluble" in the aqueous alkaline developer.

Thermally imageable elements comprise a photothermal conversion material. In the single layer, positive working thermally imageable elements of the invention, the photothermal conversion material is in the imageable layer and/or in a separate absorber layer between the imageable layer and the substrate.

When an absorber layer is present, it preferably consists essentially of the photothermal conversion material and, optionally, a surfactant. It may be possible to use less of the photothermal conversion material if it is present in a separate absorber layer rather than either the underlayer and/or the imageable layer. When an absorber layer is present, the imageable layer is preferably substantially free of photothermal conversion material, i.e. the imageable layer preferably does not absorb radiation used for imaging, typically radiation in the range of 800 nm to 1200 nm. The absorber layer preferably has a thickness sufficient to absorb at least 90%, preferably at least 99%, of the imaging radiation. Typically the absorber layer has a coating weight of about 0.02 $g/m^2$ to about 2 $g/m^2$, preferably about 0.05 $g/m^2$ to about 1.5 $g/m^2$.

Photothermal conversion materials absorb radiation and convert it to heat. Photothermal conversion materials may absorb ultraviolet, visible, and/or infrared radiation and convert it to heat. Although the first polymeric material may itself comprise an absorbing moiety, i.e., be a photothermal conversion material, typically the photothermal conversion material is a separate compound.

The imaging radiation absorber may be either a dye or pigment, such as a dye or pigment of the squarylium, merocyanine, indolizine, pyrylium, or metal diothiolene class. Examples of absorbing pigments are Projet 900, Projet 860 and Projet 830 (all available from the Zeneca Corporation), and carbon black. Dyes, especially dyes with a high extinction coefficient in the range of 750 nm to 1200 nm, are preferred. Absorbing dyes are disclosed in numerous publications, for example, Nagasaka, EP 0,823,327; Van Damme, EP 0,908,397; DeBoer, U.S. Pat. No. 4,973,572; Jandrue, U.S. Pat. No. 5,244,771; and Chapman, U.S. Pat. No. 5,401,618. Examples of useful absorbing dyes include, ADS-830A and ADS-1064 (American Dye Source, Montreal, Canada), EC2117 (FEW, Wolfen, Germany), Cyasorb IR 99 and Cyasorb IR 165 (Glendale Protective Technology), Epolite IV-62B and Epolite III-178 (Epoline), PINA-780 (Allied Signal), SpectraIR 830A and SpectraIR 840A (Spectra Colors), and Trump IR Dye (Eastman Kodak, Rochester, N.Y.).

The amount of photothermal conversion material in the element is generally sufficient to provide an optical density of at least 0.05, and preferably, an optical density of from about 0.5 to about 2 at the imaging wavelength. As is well known to those skilled in the art, the amount of an absorber required to produce a particular optical density can be determined from the thickness of the layer and the extinction coefficient of the absorber at the wavelength used for imaging using Beers law.

Negative Working Photoimageable Elements

The imageable layer may comprise a negative working photoimageable composition. The composition may be photoimageable, photocrosslinkable, or photodimerizable. Such systems are well known in the art, and are discussed, for example, in "Photopolymers: Radiation Curable Imaging Systems," by B. M. Monroe, in *Radiation Curing: Science and Technology*, S. P. Pappas, Ed., Plenum, N.Y., 1992, pp. 399–440, and "Polymer Imaging" by A. B. Cohen and P. Walker, in *Imaging Processes and Material*, J. M. Sturge, et al., Eds, Van Nostrand Reinhold, N.Y., 1989, pp. 226–262.

Photopolymerizable compositions comprise at least one ethylenically unsaturated compound that undergoes free-radical initiated polymerization, generally known as a monomer. The monomers are typically multifunctional, i.e., they comprise more than one ethylenically unsaturated, free radical polymerizable group. Typical multifunctional monomers are unsaturated esters of alcohols, preferably acrylate and methacrylate esters of polyols. Oligomers and/or prepolymers, such as urethane acrylate and methacrylate, epoxide acrylate and methacrylate, polyester acrylate and methacrylate, polyether acrylate and methacrylate or unsaturated polyester resins, may also be used. Numerous other unsaturated monomers polymerizable by free-radical initiated polymerization and useful in photopolymerizable compositions are known to those skilled in the art. Typical compositions are, by weight, binder(s) 25 to 90%, preferably 45 to 75%; monomer(s), 5 to 60%, preferably, 15 to 50%; photoinitiator system, 0.01 to 10%, preferably 0.1 to 5%; and other ingredients, 0 to 5%, typically 0 to 4%.

The compositions used in the elements of the invention comprise a first polymeric material, or binder, that has a multiplicity of carboxyl, carboxylic acid anhydride, phenolic hydroxyl, or sulphonamide groups either on the polymer backbone or on pendant groups. Numerous binders useful in photo-polymerizable compositions are known. Representative binders useful in the imageable elements of the invention include, for example, copolymers of alkyl acrylates such as methyl acrylate, and/or alkyl methacrylates such as methyl methacrylate with methacrylic acid, and/or acrylic acid.

A free radical generating, initiating system activatable by ultraviolet or visible radiation, known as a photoinitiating system, is present to facilitate polymerization of the polymerizable monomers. The photoinitiator system absorbs in ultraviolet and/or visible regions of the spectrum, i.e., in the range of from 300 to 800 nm, preferably in the ultraviolet, i.e. 300 nm to 400 nm.

The photoinitiating system may be a single compound or a mixture of compounds. Suitable photoinitiating systems are disclosed in "Photoinitiators for Free-Radical-Initiated Photoimaging Systems," by B. M. Monroe and G. C. Weed, *Chem. Rev.,* 93, 435–448 (1993) and in "Free Radical Polymerization" by K. K. Dietliker, in *Chemistry and Technology of UV and EB Formulation for Coatings, Inks, and Paints*, P. K. T. Oldring, Ed, SITA Technology Ltd., London, 1991, Vol. 3, pp. 59–525. Typical free radical photoinitiating compounds include Michlers ketone/benzophenone; benzophenone; 2-hydroxy-2-methyl-1-phenylpropan-1-one; 2,4,6-trimethylbenzolyl-diphenylphosphine oxide; 2-isopropylthioxanthone; 2-chlorothioxanthone; 2,2-dimethoxy-2-phenyl-acetophenone; 2-methyl-1-[4-(methylthio)phenyl]-2-morpholinopropanone-1; 1-hydroxycyclohexylphenyl ketone; bis(2,6-dimethoxybenzolyl)-2,4,4-trimethyl-pentylphosphine oxide; and combinations thereof.

Photocrosslinkable systems typically comprise at least one binder and a photoactivated at least bifunctional crosslinking agent that crosslinks the binder on irradiation. Organic azides have been used to crosslink binders. Diazido compounds, such as the disulfonated derivative of 4,4'-diazidostilbene, are preferred azides for photocrosslinking.

Multilayer Thermally Imageable Elements

Direct digital imaging of offset printing plates, which obviates the need for exposure through a negative, is becoming increasingly important in the printing industry. Heat-sensitive, multilayer imaging elements for the preparation of positive-working lithographic printing plates have been disclosed comprising a hydrophilic substrate, an aqueous alkali soluble underlayer, and an infrared sensitive imageable layer. On infrared exposure, the exposed regions of the imageable layer become soluble or permeable in aqueous alkali so that the developer can penetrate the imageable layer and remove the underlayer, revealing the underlying substrate. Imaging can be carried out with an infrared laser. Other layers, such as an absorber layer may also be present. Such systems are disclosed in, for example, Parsons, U.S. Pat. No. 6,280,899, and Shimazu, U.S. Pat. No. 6,294,311, both of which are incorporated herein by reference; Nagasaka, EP 0 823 327; Miyake, EP 0 909 627; West, WO 98/42507; Nguyen, WO 99/11458; and the following U.S. patent application Ser. No. 09/469,90, filed Dec. 22, 1999, Ser. No. 09/592,895, filed Jun. 13, 2000, and Ser. No. 09/638,556, filed: Aug. 14, 2000, all of which are incorporated herein by reference. In the thermally imageable positive working multilayer elements of the invention, the underlayer comprises a material that thermally crosslinks the underlayer after exposure and development of the imageable element.

Imageable Layer

Any of the imageable layers used in positive working thermally imageable multi-layer imageable elements may be used in the imageable elements of the invention. The imageable layer is ink receptive and protects the underlying layer or layers from the developer. It is insoluble in aqueous alkaline developer prior to imaging. However, exposed (i.e., imaged) regions of the imageable layer are removable by an aqueous alkaline developer after thermal exposure (i.e., thermal imaging). Though not being bound by any theory or explanation, it is believed that thermal exposure causes the imageable layer to more readily dissolve or disperse in the aqueous developer and/or weakens the bond between the imageable layer and the absorber layer, if present, or the underlayer. This allows the developer to penetrate the imageable layer and the underlying layer or layers in the exposed regions, revealing the underlying hydrophilic surface of the hydrophilic substrate.

The imageable layer may comprise a first polymeric material that is ink receptive and insoluble in the aqueous solution having a pH of about 6 or greater, and is soluble or dispersible in a solvent such as an organic solvent or an aqueous solvent dispersion. Useful materials of this type include acrylic polymers and copolymers; polystyrene; styrene-acrylic copolymers; polyesters, polyamides; polyureas; polyurethanes; nitrocellulosics; epoxy resins; and combinations thereof. Preferred polymeric materials are poly(methyl methacrylate) and polystyrene. These imageable layers are disclosed in U.S. patent application Ser. No. 09/301,866, filed Apr. 29, 1999, and WO 99/67097.

Multi-layer positive working thermally imageable elements in which the imageable layer comprises the first polymeric material, a dissolution inhibitor, and optionally, a photothermal conversion material are disclosed in, for example, Parsons, WO 97/39894; Nagasaka, EP 0 823 327; Miyake, EP 0 909 627; West, WO 98/42507; Nguyen, WO 99/11458, and U.S. application Ser. No. 09/469,489, filed Dec. 22, 1999. These imageable layers are identical with the imageable layers of the single layer positive working thermally imageable elements described above, with the exception that the photothermal conversion material may be in the underlayer instead of, or in addition to, an absorber layer and/or the imageable layer. As discussed above, the imageable layer is insoluble in aqueous alkaline developer prior to imaging, but becomes removable by aqueous alkaline developer following imaging.

Alternatively, the imageable layer may contain the first polymeric material but be free of materials that function as dissolution inhibitors for the first polymeric material. In this case, the imageable layer consists essentially of the first polymeric material. These imageable layers are releasable from the underlayer on thermal exposure. These systems are disclosed in Hauck, U.S. patent application Ser. No. 09/638,556, filed Aug. 14, 2000. In these imageable layers, the first polymeric material comprises phenolic hydroxyl groups or active imide (NH) groups. Polymeric materials that comprise active imide groups include, for example, polymeric materials that contain a substituted sulphonamide group (such as $—SO_2NHCOR$, $—SO_2NHSO_2NR$, and $—CONHSO_2NR$), and polymeric materials that comprise a —CONHCO— group. Polymers that contain phenolic hydroxyl groups, i.e., phenolic resins such as are described above, are preferred. Novolac resins, resol resins, acrylic resins that contain pendent phenol groups, and polyvinyl phenol resins are preferred phenolic resins. Novolac resins are more preferred. These systems are developed in alkaline solutions having a pH of at least 7 to about 11. Preferably the aqueous alkaline developer for these systems has a pH about 8 to about 10.5, more preferably about 9 to 10, and even more preferably about 10. Developers with a pH in the range of 13 or higher cannot be used with these systems.

If the imaging radiation is to be absorbed in the underlayer or a separate absorber layer, the dissolution inhibitor should not absorb a significant amount of the imaging radiation. The imaging radiation should pass through the imageable layer so that it is absorbed by an underlying layer. Thus, unless absorption of imaging radiation by the imageable layer is desired, when a dye is used as the dissolution inhibitor, it should not absorb significantly at the imaging wavelength, typically about 800 nm to about 1200 nm.

The imageable element is thermally exposed and developed with an aqueous alkaline developer having a pH between 7 and 11 to remove the exposed regions without removing the unexposed regions. Though not being bound by any theory or explanation, it is believed that thermal exposure modifies the imageable layer so that it is more penetrable by the developer. This allows the developer to penetrate the imageable layer and dissolve the underlayer in the exposed regions. Typically, the first polymeric material used in imageable layers of this type is insoluble in the aqueous alkaline developer used to develop the imageable element. The first polymeric material is removed and dispersed or dissolved in the developer when the developer penetrates the imageable layer in the exposed regions and dissolves or disperses the underlayer in these regions.

Underlayer

The underlayer is over the hydrophilic surface of the hydrophilic substrate. After imaging, it is removed by the aqueous alkaline developer to expose the underlying hydrophilic surface of the substrate. It is preferably soluble in the aqueous alkaline developer to prevent sludging of the developer. Preferably it is soluble in a wholly aqueous developer, i.e. one that does not include added organic solvents.

The underlayer comprises a second polymeric material. The second polymeric material is soluble in an aqueous alkaline developer. In addition, the second polymeric material should be insoluble in the solvent used to coat the imageable layer so that the imageable layer can be coated over the underlayer without dissolving the underlayer.

Polymeric materials useful as the second polymeric material include those that comprises one or more functional groups selected from the group consisting of carboxyl, carboxylic acid anhydride, phenolic hydroxyl, and sulphonamide, and mixtures of such materials. Useful polymeric materials include carboxy functional acrylics, vinyl acetate/crotonate/vinyl neodecanoate copolymers, styrene maleic anhydride copolymers, phenolic resins, maleated wood rosin, and combinations thereof.

Particularly useful second polymeric materials are copolymers that comprise N-substituted maleimides, especially N-phenylmaleimide; polyvinylacetals; methacrylamides, especially methacrylamide; and acrylic and/or methacrylic acid, especially methacrylic acid. The preferred polymeric materials of this type are copolymers of N-phenylmaleimide, methacrylamide, and methacrylic acid, more preferably those that contain about 25 to about 75 mol %, preferably about 35 to about 60 mol % of N-phenylmaleimide; about 10 to about 50 mol %, preferably about 15 to about 40 mol % of methacrylamide; and about 5 to about 30 mol %, preferably about 10 to about 30 mol %, of methacrylic acid. Other hydrophilic monomers, such as hydroxyethyl methacrylate, may be used in place of some or all of the methacrylamide. Other aqueous alkaline soluble monomers, such as acrylic acid, may be used in place of some or all of the methacrylic acid. These polymeric materials are soluble in aqueous alkaline developers. In addition they are soluble in methyl lactate/methanol/dioxolane (15:42.5:42.5 wt %) mixture, which can be used as the coating solvent for the underlayer. However, they are poorly soluble in solvents such as acetone, which can be used as solvents to coat the top layer on top of the underlayer without dissolving the underlayer. These polymeric materials are typically resistant to washes with 80 wt % diacetone alcohol/20 wt % water.

Another group of preferred polymeric materials for the second polymeric material are aqueous alkaline developer soluble copolymers that comprise a monomer that has a urea bond in its side chain (i.e., a pendent urea group), such are disclosed in Ishizuka, U.S. Pat. No. 5,731,127, incorporated herein by reference. These copolymers comprise about 10 to 80 wt %, preferably about 20 to 80 wt %, of one or more monomers represented by the general formula:

$$[CH_2{=}C(R){-}CO_2{-}X{-}NH{-}CO{-}NH{-}Y{-}Z],$$

in which R is —H or —$CH_3$; X is a bivalent linking group; Y is a substituted or unsubstituted bivalent aromatic group; and Z is —OH, —COOH, or —$SO_2NH_2$.

R is—preferably $CH_3$. Preferably X is a substituted or unsubstituted alkylene group, substituted or unsubstituted phenylene [$C_6H_4$] group, or substituted or unsubstituted naphthalene [$C_{10}H_6$] group; such as —$(CH_2)_n$—, in which n is 2 to 8; 1,2-, 1,3-, and 1,4-phenylene; and 1,4-, 2,7-, and 1,8-naphthalene. More preferably X is unsubstituted and even more preferably n is 2 or 3; most preferably X is —($CH_2CH_2$)—. Preferably Y is a substituted or unsubstituted phenylene group or substituted or unsubstituted naphthalene group; such as 1,2-, 1,3-, and 1,4-phenylene; and 1,4-, 2,7-, and 1,8-naphthalene. More preferably Y is unsubstituted, most preferably unsubstituted 1,4-phenylene. Z is —OH, —COOH, or —$SO_2NH_2$, preferably —OH. A preferred monomer is:

$$[CH_2{=}C(CH_3){-}CO_2{-}CH_2CH_2{-}NH{-}CO{-}NH\text{-}p\text{-}C_6H_4{-}Z],$$

in which Z is —OH, —COOH, or —$SO_2NH_2$, preferably —OH.

In the synthesis of a copolymer, one or more of the urea group containing monomers may be used. The copolymers also comprise 20 to 90 wt % other polymerizable monomers, such as maleimide, acrylic acid, methacrylic acid, acrylic esters, methacrylic esters, acrylonitrile, methacrylonitrile, acrylamides, and methacrylamides. A copolymer that comprises in excess of 60 mol % and not more than 90 mol % of acrylonitrile and/or methacrylonitrile in addition to acrylamide and/or methacrylamide provides superior physical properties. More preferably the alkaline soluble copolymers comprise 30 to 70 wt % urea group containing monomer; 20 to 60 wt % acrylonitrile or methacrylonitrile, preferably acrylonitrile; and 5 to 25 wt % acrylamide or methacrylamide, preferably methacrylamide. These polymeric materials are typically resistant to washes with 80 wt % 2-butoxyethanol/20 wt % water. The polymeric materials described above are soluble in aqueous alkaline developers. In addition, they are soluble in polar solvents, such as ethylene glycol monomethyl ether, which can be used as the coating solvent for the underlayer. However, they are poorly soluble in less polar solvents, such as 2-butanone (methyl ethyl ketone), which can be used as a solvent to coat the top layer over the underlayer without dissolving the underlayer.

Both these groups of polymeric materials can be prepared by methods, such as free radical polymerization, well known to those skilled in the art. Synthesis of the aqueous alkaline soluble copolymers that have urea bonds in their side chains is disclosed, for example, in Ishizuka, U.S. Pat. No. 5,731,127.

Other aqueous alkaline developer soluble polymeric materials may be useful in the underlayer. Derivatives of methyl vinyl ether/maleic anhydride copolymers that contain an N-substituted cyclic imide moiety and derivatives of styrene/maleic anhydride copolymers that contain an N-substituted cyclic imide moiety may be useful if they have the required solubility characteristics. These copolymers can be prepared by reaction of the maleic anhydride copolymer with an amine, such as p-aminobenzenesulfonamide, or p-aminophenol, followed by ring closure by acid.

Another group of polymeric materials that are useful in the underlayer include aqueous alkaline developer soluble copolymers that comprise about 10 to 90 mol % of a sulfonamide monomer unit, especially those that comprise N-(p-aminosulfonylphenyl)methacrylamide, N-(m-aminosulfonylphenyl)methacryl-amide N-(o-aminosulfonylphenyl)methacrylamide, and/or the corresponding acrylamide. Useful alkaline developer soluble polymeric materials that comprise a pendent sulfonamide group, their method of preparation, and monomers useful for their preparation, are disclosed in Aoshima, U.S. Pat. No. 5,141,838, incorporated herein by reference. Particularly useful polymeric materials comprise (1) the sulfonamide monomer unit, especially N-(p-aminosulfonylphenyl) methacrylamide; (2) acrylonitrile and/or methacrylonitrile; and (3) methyl methacrylate and/or methyl acrylate. These polymeric materials are typically resistant to washes with 80 wt % 2-butoxyethanol/20 wt % water.

Combinations of alkaline developer soluble polymeric materials may be used in the underlayer to provide improved chemical resistance, i.e., resistance to both fountain solution and to aggressive washes. A combination of a polymeric material that is resistant to 80 wt % diacetone alcohol/20 wt % water, which tests resistance to a UV wash, with a polymeric material that is resistant to 80 wt % 2-butoxyethanol/20 wt % water, which tests resistance to alcohol sub fountain solution, surprisingly produces a layer that shows good resistance to both solvent mixtures. Preferably, the first polymeric material has a one-minute soak loss of less than about 20%, more preferably less than about 10%, and most preferably less than about 5% in 80 wt % diacetone alcohol/20 wt % water, and the second polymeric material has a one-minute soak loss of less than about 20%, more preferably less than about 10%, and most preferably less than about 10%, in 80 wt % 2-butoxyethanol/20 wt % water. One-minute soak loss is measured by coating a layer of the polymeric material on a substrate, typically at a coating weight of about 1.5 $g/m^2$, soaking the coated substrate in the appropriate solvent for one minute at room temperature, drying the coated substrate, and measuring the weight loss as a percent of the total weight of polymeric material present on the substrate.

Combination of (1) a copolymer that comprises N-substituted maleimides, especially N-phenylmaleimide; methacrylamides, especially methacrylamide; and acrylic and/or methacrylic acid, especially methacrylic acid (2) with an alkaline soluble copolymer that comprises a urea in its side chain or with an alkaline soluble copolymer that comprises 10 to 90 mol % of a sulfonamide monomer unit, especially one that comprise N-(p-aminosulfonylphenyl) methacrylamide, N-(m-aminosulfonylphenyl) methacrylamide N-(o-aminosulfonylphenyl) methacrylamide, and/or the corresponding acrylamide, is especially advantageous. One or more other polymeric materials, such as novolac resins, may also be present in the combination. Preferred other polymeric materials, when present, are novolac resins.

When a combination of polymeric materials is used, the underlayer typically comprises about 10% to about 90% by weight of the polymeric material that is resistant to 80 wt % diacetone alcohol/20 wt % water, and about 10% to about 90% by weight of the polymeric material that is resistant to 80 wt % 2-butoxyethanol/20 wt % water, based on the total weight these polymeric materials in the underlayer. Preferably the underlayer comprises about 40% to about 85% by weight of the polymeric material that is resistant to 80 wt % diacetone alcohol/20 wt % water and about 15% to about 60% of the polymeric material that is resistant to 80 wt % 2-butoxyethanol/20 wt % water, based on the total weight the first and second polymeric materials in the underlayer. The first and second polymeric materials together typically comprise at least about 50 wt %, preferably at least about 60 wt %, and more preferably at least about 65 wt %, of the underlayer, based on total weight of the materials in the underlayer. Up to about 20 wt %, preferably about 1 to about 20 wt %, of other polymeric materials may be present in the underlayer, based on the total amount of all the polymeric materials in the underlayer.

The underlayer also comprises at least one crosslinking agent, i.e., a compound that comprises a multiplicity of thermally activated crosslinking groups. The crosslinking groups crosslink the second polymeric material after exposure and development of the imageable element to produce a printing plate with improved solvent and abrasion resistance.

Any thermally activated crosslinking groups that will thermally crosslink the second polymeric material, i.e., the material that comprises one or more functional groups selected from the group consisting of carboxyl, carboxylic acid anhydride, phenolic hydroxyl, and sulphonamide, after exposure and development may be used in the crosslinking agent. It is important that the crosslinking agent not crosslink the polymeric material until after exposure and development of an imaged imageable element. That is, the thermally activated crosslinking groups should not substantially crosslink the polymeric material prior to the baking step. If the polymeric material is crosslinked before development, the layer will not be cleanly removed in the exposed regions. Further, the thermally activated crosslinking groups should not crosslink the polymeric material during thermal exposure. If the polymeric material is crosslinked during thermal exposure, the layer that comprises the crosslinking agent will not be cleanly removed in the exposed regions.

No significant crosslinking should occur during manufacture, normal handling, or storage of the imageable element. Epoxides, for example, can crosslink the polymeric material before exposure and development of the imageable element. Thus, elements that comprise epoxide crosslinking agents typically age rapidly and have poor shelf life. Consequently, epoxides are less desirable as the crosslinking agent in the imageable elements of this invention.

The crosslinking agent comprises a multiplicity of, i.e., two or more, thermally activated crosslinking groups. The crosslinking agent may be a separate compound. Or the crosslinking groups may be attached to the polymeric material so that the polymeric material also functions as the crosslinking agent. When the crosslinking agent is a separate compound, the layer typically comprises about 2 wt % to about 30 wt %, preferably about 10 wt % to about 15 wt % of the crosslinking agent.

A preferred crosslinking group is the oxazoline group. One group of preferred crosslinking agents is the polyfunctional oxazolines (i.e., compounds with two or more oxazoline groups), preferably bisoxazolines (i.e., compounds with two oxazoline groups). Surprisingly, the oxazoline group does not crosslink the second polymeric material during thermal exposure (imaging) of the thermally imageable element or development. The element develops cleanly after thermal imaging. A preferred bisoxazolines is phenylene-1, 3-bisoxazoline.

When the photothermal conversion material is present in the underlayer, the underlayer typically comprises at least about 0.1 wt % of the photothermal conversion material, and preferably from about 1 to about 30 wt % of the photothermal conversion material.

Other Components

The imageable layer of any of the elements described above may also comprise one or more ingredients that are conventional components of imageable elements. These include, for example, dyes to aid in the visual inspection of the exposed and/or developed element. Printout dyes distinguish the exposed regions from the unexposed regions during processing. Contrast dyes distinguish the unimaged regions from the imaged regions in the developed plate. Surfactants are often used, for example, as aids in the coating process.

The imageable layer may also comprise a cellulose polymer or polymers to improve the resistance of the layer to blanket washes with, for example, petroleum ethers, glycols, glycol ethers, and branched alkanols, for example isopropyl alcohol and 1-methoxypropan-2-ol. Preferably the imageable layer comprises a carboxylic acid containing cellulose polymer, such as cellulose acetate phthalate, cellulose acetate hydrogen phthalate, and/or cellulose acetate trimellitate. Typically the cellulose polymer comprises 0.1% to 50% by weight, preferably 5% to 20% by weight, and more preferably 8% to 12% by weight of the imageable layer. The acid number for the cellulose polymer is typically 50–210, preferably 100–180.

The imageable layer and/or the underlayer may comprise particulate material to improve both the scratch resistance and presslife of the exposed and developed element.

Typically, the particles have an average diameter about 0.5 μm and about 10 μm. Organic and/or inorganic particulate material may be used. Examples of organic particles are crosslinked polystyrene beads and polymethyl methacrylate beads. Non-crosslinked polymers such as polycarbonate and acrylonitrile-butadiene copolymers, which form particles in situ during the drying process, are also useful in improving presslife of the exposed and developed elements. Inorganic particles include, for example, silica and alumina particles. The amounts of particles used can range from 0.5% to 30% of the coating weight of the layer, preferably 5% to 15%.

Preparation of the Imageable Element

The imageable elements may be prepared using conventional techniques. If the imageable layer is the only layer present, it may be coated or laminated over the hydrophilic surface of the hydrophilic substrate. If more than one layer is present, the imageable element may be prepared by sequentially applying the layers over the hydrophilic surface of the hydrophilic substrate using conventional coating or lamination methods. However, it is important to avoid intermixing the layers during this process.

The underlayer may be applied over the hydrophilic substrate by any conventional method. Typically the ingredients are dispersed or dissolved in a suitable coating solvent, and the resulting mixtures coated by conventional methods, such as spin coating, bar coating, gravure coating, or roller coating. The imageable layer, or second layer, may be applied over the underlayer, typically to the surface of the underlayer by any conventional method, such as those listed above. The term “solvent” includes mixtures of solvents, especially mixtures of organic solvents.

Selection of the solvents used to coat the underlayer, the absorber layer if present, and the imageable layer will depend on the nature of the second polymeric material, the photothermal conversion material, the second polymeric material, and the other ingredients present in the layers. To prevent the underlayer from dissolving and mixing with the layer coated over it, the layer coated over the underlayer should be coated from a solvent in which the second polymeric material is essentially insoluble. If the imageable layer is coated over the underlayer, the coating solvent for the imageable layer should be a solvent in which the first polymeric material is sufficiently soluble that the imageable layer can be formed and in which the second polymeric material is essentially insoluble. Although the solvents used depend on the nature of the polymeric materials, typically the second polymeric material will be soluble in more polar solvents and insoluble in less polar solvents so that the solvent used to coat the underlayer is more polar than the solvent used to coat the imageable layer. Consequently, the imageable layer can typically be coated from a conventional organic solvent such as toluene or 2-butanone. An intermediate drying step, i.e., drying the underlayer to remove coating solvent before coating the imageable layer over it, may also be used to help prevent mixing of the layers.

To prevent intermixing of the layers, a barrier layer may be coated between the imageable layer and the underlayer. The barrier layer comprises a third polymeric material that is soluble in aqueous alkaline developer. The third polymeric material is preferably soluble in at least one organic solvent in which the second organic polymeric material is insoluble. Preferably, the third polymeric material is soluble in at least one organic solvent in which the first polymeric material and the second polymeric material are insoluble. However, the third polymeric material may be the same as the second polymeric material. In this embodiment, the barrier layer comprises the same polymeric material as the underlayer. However, the barrier layer is applied as a material substantially free of photothermal conversion material. The third polymeric material may be selected from the polymeric materials described as the second polymeric material. In addition to these, a preferred third polymeric material is polyvinyl alcohol.

The imageable layer may be coated as an aqueous dispersion to avoid dissolving the underlayer during the coating process. Alternatively, the underlayer, the imageable layer or both layers may be applied by conventional extrusion coating methods from a melt mixture of layer components. Typically, such a melt mixture contains no volatile organic solvents.

Imaging and Processing

Imaging of the imageable element may be carried out by well-known methods. Photoimageable elements are imaged by exposure to actinic radiation that is absorbed by the photoreactive components of the element. Any convenient source or sources of actinic radiation providing wavelengths in the region of the spectrum that overlap the absorption bands of the photoimageable layer can be used for imaging. By “actinic radiation” is meant any radiation that can induce photoimaging. Exposure is typically with ultraviolet and/or visible radiation. o-Diazonaphthoquinone compounds substituted in the 5-position typically absorb at 350 and 400 nm. o-Diazonaphthoquinone compounds substituted in the 4-position typically absorb at 310 and 390 nm. Conventional light sources include carbon arc lamps, mercury lamps, xenon lamps, tungsten lamp, metal halide lamps, and fluorescent lamps. Coherent light sources are lasers, such as xenon, argon ion, and ionized neon lasers, as well as tunable dye lasers and the frequency doubled neodymium: YAG laser. Imagewise exposure is typically carried out through a photomask, but direct digital exposure with a laser emitting at the appropriate wavelength is also possible.

The thermally imageable elements may be imaged with a laser or an array of lasers emitting modulated near infrared or infrared radiation in a wavelength region that is absorbed by the absorber layer. Infrared radiation, especially infrared radiation in the range of about 800 nm to about 1200 nm, is typically used for imaging thermally imageable elements. Imaging is conveniently carried out with a laser emitting at about 830 nm or at about 1056 nm. Suitable commercially available imaging devices include image setters such as the Creo Trendsetter (CREO, British Columbia, Canada) and the Gerber Crescent 42T (Gerber).

It is important that the imageable element not be heated at a temperature and for a time sufficient to initiate crosslinking prior to imaging and development. Suprisingly, thermal imaging does not initiate crosslinking; a thermally imaged element of the invention can be cleanly developed after imaging.

Imaging produces an imaged element, which comprises a latent image of imaged (unexposed) regions and non-imaged (exposed) regions. Development of the imaged element to form a lithographic printing plate, or printing form, converts the latent image to an image by removing the either the exposed or unexposed regions, revealing the hydrophilic surface of the underlying substrate.

For positive working photoimageable and thermally imageable elements, the developer may be any liquid or solution that can penetrate and remove the exposed regions of the imageable layer, and, if present, the underlying regions of the absorber layer and/or the underlayer, without substantially affecting the complimentary unexposed regions. While not being bound by any theory or explanation, it is believed that image discrimination is based on a kinetic effect. The exposed regions of the imageable layer are removed more rapidly in the developer than the unexposed regions. Development is carried for a long enough time to remove the exposed regions of the imageable layer, the underlying regions of the underlayer layer, and, if present, the underlying regions of the absorber layer in the developer, but not long enough to remove the unexposed regions of the imageable layer. Hence, the exposed regions are described as being "soluble" or "removable" in the developer because they are removed, and dissolved and/or dispersed, more rapidly in the developer than the unexposed regions. Typically, the underlayer is dissolved in the developer and the absorber layer, if present, is either dissolved or dispersed in the developer, and the imageable layer is dispersed or dissolved in the developer.

For imageable layers that comprise a dissolution inhibitor, useful developers are aqueous solutions having a pH of about 7 or above. Preferred aqueous alkaline developers are those that have a pH between about 8 and about 13.5, typically at least about 9, preferably at least about 10. Wholly aqueous developers, i.e., those that do not comprise an added organic solvent, are preferred. Useful developers include commercially available developers, such as PC3000, PC955, and PC9000, aqueous alkaline developers each available from Kodak Polychrome Graphics LLC. Developers are described for example, in Yamasue, U.S. Pat. No. 4,259,434; Seino, U.S. Pat. No. 4,452,880; Miller, U.S. Pat. No. 5,851,735; Eckler, U.S. Pat. No. 5,998,102; Miro, EB-A-0 732 628; Toyama, GB-A-2,276,729 (DE-A-4 411 176); and Fiebag, U.S. Pat. No. 6,143,479.

Developers for photoimageable elements useful as lithographic printing plate precursors are well known. They can be developed, for example, with an aqueous alkali solution, such as is described above.

Typically the developer is applied to the imaged element by rubbing or wiping the imageable layer with an applicator containing the developer. Alternatively, the imaged element may be brushed with the developer or the developer may be applied to the element by spraying the imageable layer with sufficient force to remove the exposed regions. In either instance, a developed element is produced.

The developed positive working element comprises (1) regions in which the imageable layer, and additional layers, if present have been removed in the exposed regions revealing the underlying surface of the hydrophilic substrate, and (2) complimentary unexposed regions in which the layer or layers have not been removed.

In the negative working element, the unexposed regions are removed, revealing the underlying surface of the hydrophilic substrate. The regions of the layer or layers that have not been removed are ink receptive and correspond to the regions that were not exposed during imaging.

Following development, the imaged and developed element is typically rinsed with water and dried. Drying may be conveniently carried out by infrared radiators or with hot air. After drying, imaged and developed elements derived from positive working imageable elements may be treated with a gumming solution, if desired. A gumming solution comprises one or more water-soluble polymers, for example polyvinyl alcohol, polymethacrylic acid, polymethacrylamide, polyhydroxyethylmethacrylate, polyvinylmethylether, gelatin, and polysaccharide such as dextran, pullulan, cellulose, gum arabic, and alginic acid. A preferred material is gum arabic.

Then, the imaged and developed element is heated, or baked, to activate the crosslinking agent and crosslink the underlayer. Although the conditions will depend on the nature of both the crosslinking agent and of the polymeric material that comprises one or more functional groups selected from the group consisting of carboxyl, carboxylic acid anhydride, phenolic hydroxyl, and sulphonamide, the conditions are typically at about 180° C. to 300° C. for about 0.5 to about 8 min, and typically using a conveyor oven at about 280° C. for about 110 sec.

The advantageous properties of this invention can be observed by reference to the following examples, which illustrate but do not limit the invention.

EXAMPLES

| Glossary | |
|---|---|
| Copolymer 1 | Copolymer of N-phenylmaleimide, methacrylamide, and methacrylic acid (45:35:20 mol %) |
| GANTREZ®AN 119 | Methyl vinyl ether/maleic anhydride copolymer; MW about 190,000 (International Specialty Products, Wayne, N.J., USA) |
| Dye A | Trump IR Dye; Infrared absorbing dye ($\lambda_{max}$ = 830 nm) (Eastman Kodak, Rochester, N.Y., USA) |
| N13 | m-Cresol novolac resin (Eastman Kodak, Rochester, N.Y., USA) |
| 1,3-PBO | Phenylene-1,3-bisoxazoline (Takeda, Osaka, Japan) |

Dye A

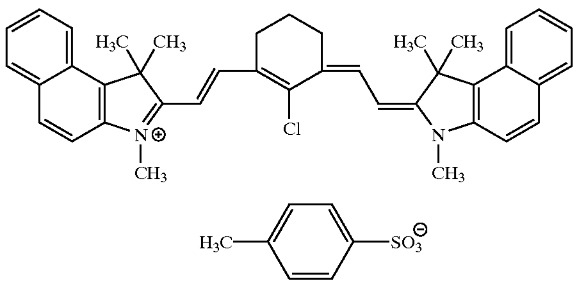

Example 1

This example describes the preparation of Copolymer 1. Methyl glycol (800 mL) was placed in a 1 L round-bottomed flask equipped with a stirrer, thermometer, nitrogen inlet and reflux condenser. Methacrylic acid (36.12 g), N-phenylmaleimide (165.4 g), and methacrylamide (62.5 g) were added and dissolved with stirring. 2,2-Azobisisobutyronitrile (AIBN) (3.4 g) was added and the reaction mixture heated at 60° C. with stirring for 22 hr. Then methanol was added, and the precipitated copolymer filtered, washed twice with methanol, and dried in the oven at 40° C. for 2 days.

If the polymerization is carried out in 1,3-dioxolane, in some cases reprecipitation can be avoided. The monomers are soluble in 1,3-dioxolane, but the polymeric material is insoluble and precipitates during the reaction.

By appropriate modification of the relative amounts of methacrylic acid, N-phenylmaleimide, and methacrylamide used in the reaction, other methacrylic acid/N-phenylmaleimide/methacrylamide copolymers may be prepared by this general procedure. For example, a copolymer of N-phenylmaleimide, methacrylamide, and methacrylic acid (50:35:15 mol %) may be prepared using methacrylic acid (27.1 g), N-phenylmaleimide (183.7 g), methacrylamide (62.5 g), and AIBN (3.4 g).

Example 2

This example describes the preparation of a sulfonamide copolymer. It is important to initially form the acid amide and fully react the anhydride without ring-closure. Ring closure forms water, which can hydrolyze unreacted anhydride and prevent formation of the amide. To minimize premature ring closure, the reactants were added and maintained at the reduced temperature of 5° C. until the acid amide had formed.

GANTREZ® AN 119 copolymer (250 g) (about 1.6 M of anhydride) was dissolved in 1360 g of anhydrous N-methyl pyrrolidone (NMP). Anhydrous glacial acetic acid (801 g) was slowly added with stirring, taking care to avoid precipitation of the copolymer. The reaction mixture was cooled in a water bath and maintained at 5° C. while 138 g of sulphanilamide (0.8 M) was added very slowly and dissolved by vigorous stirring. After the reaction mixture was stirred for 30 min, 78.6 g of cyclohexylamine (0.8 M) was mixed with 127 g of NMP and added. The reaction was stirred for 16 hr at 5° C. Then reaction mixture was heated to about 98–100° C. for about 2.5 hr.

The sulfonamide copolymer was precipitated by slowly adding the reaction mixture to dilute hydrochloride solution. It was filtered and dried by placing in a fan oven at 40° C. until constant weight was achieved. Yield: 418 g of the sulfonamide copolymer (95%).

Example 3

This example illustrates preparation and evaluation of a positive-working multi-layer thermally imageable element that comprises a crosslinking agent in the underlayer.

Copolymer 1 (2.22 g), 1,3-PBO (0.26 g), and Dye A (0.39 g) were dissolved in 30 mL of 2-methoxyethanol and coated onto a substrate to produce an under layer with a coating weight of 2.0 g/m$^2$. The substrate was an aluminum sheet that had been electrochemically grained, anodized, and coated with polyvinyl phosphonic acid.

Novolac resin N13 (2.48 g), tosylated to 10 mol % tosyl groups, was dissolved in 30 mL of iso-propyl alcohol: ethyl acetate (50:50 wt %) and coated over the underlayer to give a imageable layer with a coating weight of 0.5 g/m$^2$. The resulting thermally imageable element was dried at 90° C. for 10 min.

Two elements were imaged and developed as described above. A good image with a clean background was obtained.

Comparative Example 1

This example illustrates preparation and evaluation of a positive-working multi-layer thermally imageable element that does not comprise a crosslinking agent in the underlayer.

Copolymer 1 (2.22 g) and Dye A (0.39 g) were dissolved in 30 mL of 2-methoxyethanol and coated onto a substrate to produce an underlayer as described in Example 3. The imageable layer of Example 3 was coated over the underlayer and resulting multi-layer thermally imageable element dried, imaged, and developed as described in Example 3.

Example 4

The multi-layer thermally imageable elements produced in Example 3 and in Comparative Example 1 were evaluated as described below.

Exposure and Processing—The imageable elements were exposed with a Creo 3244 Trendsetter (CREO, British Columbia, Canada) infrared exposure unit at an energy of 9.5 W and a drum rotational speed 160 rpm. They were developed with negative developer 956 (pH about 10) (Kodak Polychrome Graphics, LLC).

Baking—Developed printing plates were gummed with 804 baking gum and baked at 280° C. for 110 sec Thermal Stability—Thermal stability under ambient conditions was tested by conditioning the imaged, undeveloped element at 90° C. for 1 hr. The element was developed and development speed measured by the drop test.

Drop Test—The speed of development was determined by the drop test. Elongated drops of developer were placed on a 7 cm×30 cm strip of undeveloped printing plate at 5 sec intervals over a 30 sec period. The plate was then rinsed and the time at which the coating developed clean was noted. A drop test within 10 sec is considered to be a good development speed.

Resistance to UV Wash—Resistance to UV wash is tested by measuring resistance to 80 wt % diacetone alcohol (DAA)/20 wt % water. After processing, the printing plate was soaked in 80 wt % DAA/20 wt % water for 5 min, dried, and the weight loss determined.

Resistance to Alcohol sub Fountain Solution—After processing, the developed and baked printing plate was soaked in 80 wt % 2-butoxyethanol/–20 wt % water for 5 min, dried, and the weight loss determined. This test measures the resistance of the plate to alcohol sub fountain solution.

Deletion—Deletion Fluid T 167 was applied to the developed and baked printing plate for various time periods and then wiped off. The attack on the coating was evaluated. This test gives an indication of the amount of crosslinking in the underlayer.

Abrasion Resistance—The developed and baked printing plate was rubbed with a 1.5 wt % slurry of Primisil particles (inorganic particles from Lehman and Ross) in water. The weight loss of the layer was determined.

The results are given in Table 1.

TABLE 1

| Evaluation Procedure | Example 3 | Comparative Example 1 |
|---|---|---|
| Drop Test | 20 sec | 15 sec |
| Drop test after Thermal Conditioning | 20 sec | 15 sec |
| 80% DAA/20% Water Soak Test | 16% | 23% |
| 80 wt % 2-Butoxyethanol/-20 wt % Water Soak Test | 19% | 16% |
| Deletion with Deletion Fluid | No attack in 8 min | Attack within 3 min |
| Abrasion Test | 38% | 65% |

Example 5

The procedure of Example 3 was repeated except that the underlayer of the thermally imageable element comprised 5 wt % 1,3-PBO. The element was evaluated as described in Example 4. Weight loss in the 80% DAA/20% water soak test was 9%. Weight loss in the 80 wt % 2-butoxyethanol/20 wt % water soak test was 10%. There was slight attack by deletion fluid in 8 min. Weight loss in the abrasion test was 53%.

Example 6

The procedure of Example 3 was repeated except that the underlayer of the thermally imageable element comprised 15 wt % 1,3-PBO. The element was evaluated as described in Example 4. Weight loss in the 80% DA/20% water soak test was 11%. Weight loss in the 80 wt % 2-butoxyethanol/20 wt % water soak test was 15%. There was no attack by deletion fluid in 8 min. Weight loss in the abrasion test was 32%.

Example 7

This example illustrates preparation and evaluation of a positive-working two-layer thermally imageable element that comprises a crosslinking agent in the underlayer.

A multi-layer positive-working thermally imageable element was prepared as in Example 3 and exposed and developed as described in Example 4, except that the sulfonamide copolymer produced in Example 2 was used in place of Copolymer 1. Following infrared exposure at an energy of 9.5 W and a drum rotational speed of 120 rpm and development as described above, a good clean image with a clean background was obtained.

Having described the invention, we now claim the following and their equivalents.

What is claimed is:

1. An imageable element comprising, in order:

(a) a substrate comprising a hydrophilic surface; and (b) an imageable layer over the hydrophilic surface; in which:
  - the imageable layer is ink receptive;
  - the element comprises a compound that comprises a multiplicity of oxazoline groups;
  - the element comprises a polymeric material that comprises one or more functional groups selected from the group consisting of carboxyl, carboxylic acid anhydride, phenolic hydroxyl, and sulphonamide; and
  - the compound that comprises the multiplicity of oxazoline groups and the polymeric material that comprises one or more functional groups selected from the group consisting of carboxyl, carboxylic acid anhydride, phenolic hydroxyl, and sulphonamide are in the same layer.

2. The imageable element of claim 1 in which:

the element does not comprise an alkali soluble underlayer between the imageable layer and the substrate; and the imageable layer comprises both the compound that comprises the multiplicity of oxazoline groups and the polymeric material that comprises one or more functional groups selected from the group consisting of carboxyl, carboxylic acid anhydride, phenolic hydroxyl, and sulphonamide.

3. The element of claim 2 in which the polymeric material is water insoluble and alkali soluble, and the imageable layer comprises a material that comprises a photosensitive moiety.

4. The element of claim 3 in which the photosensitive moiety is a diazonaphthoquinone moiety and the polymeric material comprises a multiplicity of phenolic hydroxyl groups.

5. The element of claim 4 in which the polymeric material comprises a novolac resin, a derivatized novolac resin, or a mixture thereof.

6. The element of claim 5 in which the compound that comprises a multiplicity of oxazoline groups is phenylene-1,3-bisoxazoline.

7. The element of claim 2 in which the polymeric material is water insoluble and alkali soluble, the imageable layer additionally comprises a dissolution inhibitor, and the element comprises a photothermal conversion material.

8. The element of claim 7 in which the imageable layer comprises the photothermal conversion material.

9. The element of claim 8 in which the polymeric material comprises a novolac resin, a derivatized novolac resin, or a mixture thereof.

10. The element of claim 9 in which the compound that comprises a multiplicity of oxazoline groups is phenylene-1,3-bisoxazoline.

11. The element of claim 7 in which the element additionally comprises an absorber layer between the imageable layer and the substrate, and the absorber layer consists essentially of the photothermal conversion material.

12. The element of claim 11 in which the polymeric material comprises a novolac resin, a derivatized novolac resin, or a mixture thereof.

13. The element of claim 12 in which the compound that comprises a multiplicity of oxazoline groups is phenylene-1,3-bisoxazoline.

14. The element of claim 2 in which the imageable layer additionally comprises a monomer and a photoinitiator system.

15. The element of claim 14 in which the compound that comprises a multiplicity of oxazoline groups is phenylene-1,3-bisoxazoline.

16. A positive-working imageable element comprising, in order:

(a) a substrate comprising a hydrophilic surface;

(b) an underlayer over the hydrophilic surface; and (c) an imageable layer;

in which:
  - the element comprises a photothermal conversion material;
  - the imageable layer is ink receptive;
  - the imageable layer is insoluble in an aqueous alkaline developer;
  - the imageable layer comprises a first polymeric material;
  - the underlayer is soluble in the aqueous alkaline developer;
  - the underlayer comprises a polyfunctional oxazoline and a second polymeric material; and
  - the second polymeric material comprises one or more functional groups selected from the group consisting of carboxyl, carboxylic acid anhydride, phenolic hydroxyl, and sulphonamide.

17. The element of claim 16 in which the polyfunctional oxazoline is phenylene-1,3-bisoxazoline.

18. The element of claim 16 in which the second polymeric material is a copolymer of N-phenylmaleimide, methacrylamide, and methacrylic acid.

19. The element of claim 18 in which the polyfunctional oxazoline is phenylene-1,3-bisoxazoline.

20. A positive-working imageable element comprising, in order:

(a) a substrate comprising a hydrophilic surface;

(b) an underlayer over the hydrophilic surface; and (c) an imageable layer;

in which:
  - the element comprises a photothermal conversion material;
  - the imageable layer is ink receptive;
  - the imageable layer is insoluble in an aqueous alkaline developer;
  - the imageable layer comprises a first polymeric material;
  - the underlayer is soluble in the aqueous alkaline developer;

the underlayer comprises a thermally activated crosslinking agent and a second polymeric material;

the second polymeric material comprises one or more functional groups selected from the group consisting of carboxyl, carboxylic acid anhydride, phenolic hydroxyl, and sulphonamide, and the second polymeric material comprises a sulphonamide group.

21. The element of claim 20 in which the thermally activated crosslinking agent is a polyfunctional oxazoline.

22. The element of claim 21 in which polyfunctional oxazoline is phenylene-1,3-bisoxazoline.

23. The element of claim 16 in which the imageable layer comprises a phenolic polymer and a dissolution inhibitor.

24. The element of claim 23 in which the underlayer comprises the photothermal conversion material and the imageable layer is substantially free of the photothermal conversion material.

25. The element of claim 24 in which the second polymeric material is selected from the group consisting of copolymers of N-phenylmaleimide, methacrylamide, and methacrylic acid and polymers that comprises a sulphonamide group.

26. The element of claim 24 in which the polyfunctional oxazoline is phenylene-1,3-bisoxazoline.

27. The element of claim 16 in which the imageable layer consists essentially of a phenolic polymer.

28. The element of claim 27 in which the underlayer comprises the photothermal conversion material and the imageable layer is substantially free of the photothermal conversion material.

29. The element of claim 28 in which the second polymeric material is selected from the group consisting of copolymers of N-phenylmaleimide, methacrylamide, and methacrylic acid and polymers that comprises a sulphonamide group.

30. The element of claim 28 in which the polyfunctional oxazoline is phenylene-1,3-bisoxazoline.

31. A method for forming an image, the method comprising the steps of:

(a) imaging an imageable element and forming an imaged element comprising imaged and unimaged regions in the element, in which the imageable element comprises, in order:

a substrate comprising a hydrophilic surface; and an imageable layer over the hydrophilic surface;

in which:

the imageable layer is ink receptive;

the element comprises a compound that comprises a multiplicity of oxazoline groups;

the element comprises a polymeric material that comprises one or more functional groups selected from the group consisting of carboxyl, carboxylic acid anhydride, phenolic hydroxyl, and sulphonamide; and the compound that comprises the multiplicity of oxazoline groups and the polymeric material that comprises one or more functional groups selected from the group consisting of carboxyl, carboxylic acid anhydride, phenolic hydroxyl, and sulphonamide are in the same layer;

(b) forming a developed element by developing the imaged element with an aqueous alkaline developer and removing one of the imaged regions and the unimaged regions; and (c) forming the lithographic printing plate by baking the developed element and crosslinking the polymeric material with the oxazoline groups, in which the oxazoline groups do not substantially crosslink the polymeric material prior to step (c).

32. The method of claim 31 in which:

the element does not comprise an alkali soluble underlayer between the imageable layer and the substrate; and the imageable layer comprises both the compound that comprises the multiplicity of oxazoline groups and the polymeric material that comprises one or more functional groups selected from the group consisting of carboxyl, carboxylic acid anhydride, phenolic hydroxyl, and sulphonamide.

33. The method of claim 32 in which:

the imageable layer comprises a material that comprises a photosensitive moiety, the polymeric material is water insoluble and alkali soluble; and the imageable layer is imaged with ultraviolet or visible radiation.

34. The method of claim 32 in which:

the polymeric material is water insoluble and alkali soluble;

the imageable layer additionally comprises a dissolution inhibitor, the element comprises a photothermal conversion material; and the imageable layer is imaged with infrared radiation.

35. The method of claim 32 in which the imageable layer additionally comprises a monomer and a photoinitiator system; and the imageable layer is imaged with ultraviolet or visible radiation.

36. A method for forming an image, the method comprising the steps of:

(a) imaging a positive-working imageable element and forming an imaged element comprising imaged and unimaged regions in the element, in which the positive-working imageable element comprises, in order:

a substrate comprising a hydrophilic surface;

an underlayer over the hydrophilic surface; and an imageable layer;

in which:

the element comprises a photothermal conversion material;

the imageable layer is ink receptive;

the imageable layer is insoluble in an aqueous alkaline developer;

the imageable layer comprises a first polymeric material;

the underlayer is soluble in the aqueous alkaline developer;

the underlayer comprises a thermally activated crosslinking agent and a second polymeric material;

the thermally activated crosslinking agent is a compound that comprises a multiplicity of oxazoline groups; and the second polymeric material comprises one or more functional groups selected from the group consisting of carboxyl, carboxylic acid anhydride, phenolic hydroxyl, and sulphonamide;

(b) forming a developed element by developing the imaged element with an aqueous alkaline developer and removing the imaged regions; and (c) forming the lithographic printing plate by baking the developed element and crosslinking the second polymeric material, in which the thermally activated crosslinking agent does not substantially crosslink the second polymeric material prior to step (c).

37. The method of claim 36 in which the compound that comprises a multiplicity of oxazoline groups is phenylene-1,3-bisoxazoline.

38. The method of claim 36 in which the second polymeric material is a copolymer of N-phenylmaleimide, methacrylamide, and methacrylic acid.

39. The method of claim 38 in which the compound that comprises a multiplicity of oxazoline groups is a polyfunctional oxazoline.

40. The method of claim 39 in which the compound that comprises a multiplicity of oxazoline groups is phenylene-1,3-bisoxazoline.

41. The method of claim 36 in which the second polymeric material comprises a sulphonamide group.

42. The method of claim 41 in which the compound that comprises a multiplicity of oxazoline groups is phenylene-1,3-bisoxazoline.

43. The method of claim 36 in which the imageable layer comprises a phenolic polymer and a dissolution inhibitor.

44. The method of claim 43 in which the underlayer comprises the photothermal conversion material and the imageable layer is substantially free of the photothermal conversion material.

45. The method of claim 44 in which the second polymeric material is selected from the group consisting of copolymers of N-phenylmaleimide, methacrylamide, and methacrylic acid and polymers that comprises a sulphonamide group.

46. The method of claim 45 in which the compound that comprises a multiplicity of oxazoline groups is phenylene-1,3-bisoxazoline.

* * * * *